United States Patent [19]

Pedneau

[11] Patent Number: 5,377,200
[45] Date of Patent: Dec. 27, 1994

[54] POWER SAVING FEATURE FOR COMPONENTS HAVING BUILT-IN TESTING LOGIC

[75] Inventor: Michael D. Pedneau, Austin, Tex.

[73] Assignee: Advanced Micro devices, Inc., Sunnyvale, Calif.

[21] Appl. No.: 936,896

[22] Filed: Aug. 27, 1992

[51] Int. Cl.5 .................... H04B 17/00; G01R 31/02; G06F 1/30
[52] U.S. Cl. ................. 371/22.5; 324/158.1; 395/425; 395/750
[58] Field of Search ............. 371/22.1, 22.5, 22.6, 371/15.1, 21.1; 395/275, 750, 650, 425; 370/85.1, 94.1; 324/158 R, 158 SY

[56] References Cited

U.S. PATENT DOCUMENTS

| | | | |
|---|---|---|---|
| 4,969,146 | 11/1990 | Twitty et al. | 370/85.1 |
| 4,969,147 | 11/1990 | Markkula, Jr. et al. | 370/94.1 |
| 5,034,882 | 7/1991 | Eisenhard et al. | 395/650 |
| 5,060,138 | 10/1991 | Gephardt et al. | 395/275 |
| 5,182,746 | 1/1993 | Hurlbut et al. | 375/106 |
| 5,212,442 | 5/1993 | O'Toole et al. | 371/21.1 |
| 5,212,694 | 5/1993 | Fujiwara | 371/21.1 |
| 5,222,066 | 6/1993 | Grula et al. | 371/21.1 |
| 5,224,101 | 6/1993 | Popyack, Jr. | 371/15.1 |
| 5,241,680 | 8/1993 | Cole et al. | 395/750 |
| 5,274,778 | 12/1993 | Hall | 371/21.1 |

Primary Examiner—Emanuel T. Voeltz
Assistant Examiner—Alan Tran
Attorney, Agent, or Firm—Foley & Lardner

[57] ABSTRACT

A configuration register enables built-in testing logic during testing operations, and disables the testing logic during non-testing operations. When enabled, the testing logic is in a normal state, and when disabled the testing logic is in a low power state. The configuration register generates a control signal to the testing logic, the control signal being is responsive to signals received at a key input and a reset input of the configuration register. When the reset input of the configuration register is triggered, the control signal drives the testing logic to the low power state. When a signal matching a predetermined data pattern is applied to the key input, the control signal drives the testing logic to the normal state.

24 Claims, 3 Drawing Sheets

5,377,200

POWER SAVING FEATURE FOR COMPONENTS HAVING BUILT-IN TESTING LOGIC

FIELD OF INVENTION

This invention relates to a system and method for controlling built-in testing logic on electronic components, and more particularly to a system and method for disabling built-in testing logic when testing is not being performed.

BACKGROUND OF THE INVENTION

As society's dependency on computer systems and computer-controlled devices grows, it becomes increasingly important to verify the integrity of the components which make up such systems. One method of testing the integrity of a logic component consists of transmitting a series of random numbers into the input of the logic module of the component, accumulating the outputs generated by the module in a data compression register (DCR), and, when the entire series of numbers has been processed by the logic module, comparing the output signature of the DCR with a predetermined correct signature. If the DCR output signature matches the correct signature, then the logic component is functioning properly; otherwise, it is faulty.

Consequently, logic component architectures have been developed which provide built-in self-testing (BIST). Such architectures contain, in addition to a logic module, the hardware required to test the module (i.e. a pseudo random number generator (PRNG) and a DCR). During normal operation, the logic module receives data from normal inputs and transmits data to normal outputs. During testing, the logic module receives input from the PRNG and transmits its output to the DCR.

One disadvantage of current BIST architectures is that the testing logic embodied therein consumes power as it is driven by the system clock whether or not the logic module is being tested. Such unnecessary power consumption makes BIST-equipped architectures generally less energy efficient than architectures without testing logic. For example, for one circuit comprising six BIST-equipped logic modules, it has been observed that testing logic adds a power load of approximately 2.5 pF which, at each clock cycle, consumes about 23 mW of dynamic power.

It is therefore clearly desirable to provide a BIST architecture which disables testing logic when the logic module is not being tested. It is further desirable to provide means for enabling the testing logic for testing operations that will not accidentally enable the testing logic during normal operation.

SUMMARY OF THE INVENTION

The present invention provides a configuration register for controlling testing logic. The testing logic has a normal state and a low power state. The configuration register comprises a key input disposed to receive a key signal, a reset input disposed to receive a reset signal, and an output coupled to the testing logic. The configuration register further includes key logic coupled to the key input, the reset input, and the output. The key logic generates to the testing logic, through the output, a control signal responsive to the key signal and the reset signal. The control signal drives the testing logic to the low power state when the reset input is triggered by the reset signal, and the control signal drives the testing logic to the normal state when the key signal matches a predetermined data pattern.

The present invention further provides a circuit arrangement having built-in testing logic wherein the testing logic may be disabled to save power when testing operations are not being performed. The circuit arrangement includes a logic component having a logic module and the testing logic, the testing logic being coupled to the logic module and having a normal state and a low power state, and a configuration register for controlling the testing logic. The configuration register comprises a key input disposed to receive a key signal, a reset input disposed to receive a reset signal, and an output coupled to the testing logic. The configuration register further comprises key logic coupled to the key input, the reset input, and the output. The key logic generates to the testing logic, through the output, a control signal responsive to the key signal and the reset signal. The control signal drives the testing logic to the low power state when the reset input is triggered by the reset signal, and the control signal drives the testing logic to the normal state when the key signal matches a predetermined data pattern.

The present invention further provides a circuit arrangement having built-in testing logic wherein the testing logic may be disabled to save power when testing operations are not being performed. The circuit arrangement includes a logic component having a logic module and the testing logic. The testing logic is coupled to the logic module and has a normal state and a low power state. The testing logic further has a clock port. The state of the testing logic is responsive to a control signal applied at the clock port. The circuit arrangement further includes a configuration register for controlling the testing logic. The configuration register comprises a key input disposed to receive a key signal, a reset input disposed to receive a reset signal, a clock input disposed to receive a clock signal, and a signal output coupled to the clock port of the testing logic. The configuration register further includes key logic coupled to the key input and the reset input. The key logic generates a mode signal responsive to the key signal and the reset signal. The mode signal is a disable signal when the reset input is triggered by the reset signal, and the mode signal is an enable signal when the key signal matches a predetermined data pattern. The configuration register further includes a logic gate having inputs coupled to the clock input and the key logic and an output coupled to the signal output. The logic gate generates at the signal output the control signal responsive to the clock signal and the mode signal. The control signal drives the testing logic to a low power state when the mode signal is the disable signal, and the control signal drives the testing logic to the normal state when the mode signal is the enable signal.

The invention further provides a method of controlling testing logic having a low power state and a normal state. The method includes the step of providing a configuration register coupled to the testing logic. The configuration register has a key input and a reset input and generates to the testing logic a control signal. The state of the testing logic is responsive to the control signal. The method further includes the steps of generating a control signal to drive the testing logic to the normal state when a signal that matches a predetermined data pattern is applied to the key input of the configuration register, and generating a control signal to drive the testing logic to the low power state when the reset input of the configuration register is triggered.

BRIEF DESCRIPTION OF THE DRAWINGS

The features of the present invention, which are believed to be novel, are set forth with particularity in the appended claims. The invention, together with further objects and advantages thereof, may best be understood by making reference to the following description taken in conjunction with the accompanying drawings, in the several figures of which like reference numerals identify like elements, and wherein:

DETAILED DESCRIPTION OF THE PREFERRED EMBODIMENT

Figure 1:
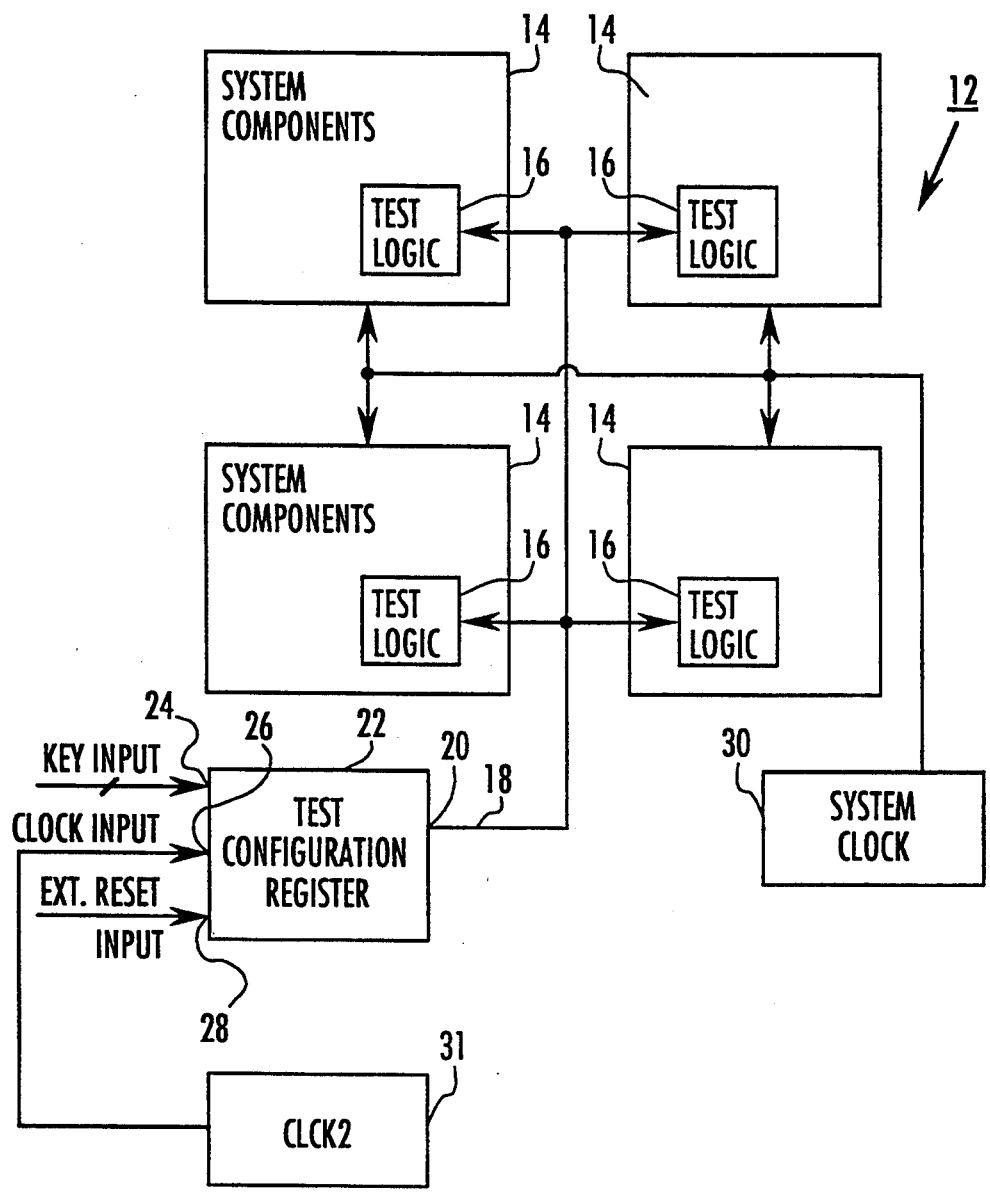
FIG. 1 is a schematic block diagram illustrating the principal components of a circuit arrangement in accordance with the present invention.

Referring to FIG. 1, a circuit arrangement 12 including a plurality of BIST-equipped logic components 14 is shown. The logic components 14 are driven by a system clock 30. Each of the logic components 14 include testing logic 16 which has a normal state and a low power state. In the normal state, the testing logic 16 is operational and consumes more power than it does when in the low power state, where it is non-operational.

The state of the testing logic 16 is controlled by a control signal transmitted at an output 20 of a test configuration register 22 over a conductor 18. Testing logic 16 is in the normal state when the control signal comprises clock pulses, and is in the low power state when the control signal is a logical LOW.

Test configuration register 22 has a TEST-ON mode and a TEST-OFF mode and operates responsive to a key signal applied to a multiple-bit key input 24, a clock signal applied to a clock input 26, and an external reset signal applied at a reset input 28. When reset input 28 is triggered, test configuration register 22 enters TEST-OFF mode and the control signal is driven LOW. Reset input 28 may be triggered, for example, when a logical HIGH is applied thereto by the external reset signal. The LOW control signal is transmitted via conductor 18 to the testing logic 16, causing testing logic 16 to enter the low power state.

Test configuration register 22 remains in the TEST-OFF mode, generating a LOW control signal to test logic 16, until a valid key signal is applied at key input 24. A valid key signal is a signal that matches a predetermined data pattern. When a valid key signal is received, test configuration register enters the TEST-ON mode. In the TEST-ON mode, test configuration register 22 generates a control signal responsive to the signal currently being received at clock input 26. When the signal applied at clock input 26 is a clock signal and test configuration register 22 is in the TEST-ON mode, a control signal comprising clock pulses is transmitted over conductor 18 to testing logic 16, which becomes operational in the normal state. When test configuration register 22 is in the TEST-ON mode, testing logic 16 may be driven by clock pulses applied at clock input 26 by system clock 30, or by a second clock signal source 31.

According to one embodiment of the invention, clock input 26 may also be coupled to the Vcc pin of circuit arrangement 12. For example, the Vcc pin of circuit arrangement 12 may be coupled to one input of an OR gate, and system clock 30 or clock signal source 31 may be coupled to the other input of the OR gate. The output signal of the OR gate may then be applied to clock input 26. Thus configured, the signal applied to clock input 26 will only be a clock signal if the Vcc pin of arrangement 12 is LOW. Since test configuration register 22 generates a clock signal to activate testing logic 16 only when test configuration register 22 is in the TEST-ON mode and a clock signal is applied to clock input 26, testing logic 16 will remain in the low power state, regardless of the mode of test configuration register 22, as long as a HIGH is applied to the Vcc pin of arrangement 12. As it is typically necessary to apply a HIGH at the Vcc pin of a circuit during normal operation of the circuit, testing logic 16 will remain in the low power state, regardless of the mode of test configuration register 22, when circuit arrangement 12 is in normal operation.

If test configuration register 22 is in the TEST-OFF mode and the key signal applied to key input 24 does not match the predetermined data pattern, then the key signal is not valid and test configuration register 22 will remain in the TEST-OFF mode. By only switching to the TEST-ON mode when the key signal applied at key input 24 matches a specific predetermined data pattern, the probability that test configuration register 22 will unintentionally switch to the TEST-ON mode is substantially decreased. Thus, test configuration register 22 will remain in the TEST-OFF mode when, for example, random data is erroneously or accidentally applied at key input 24.

Figure 2:
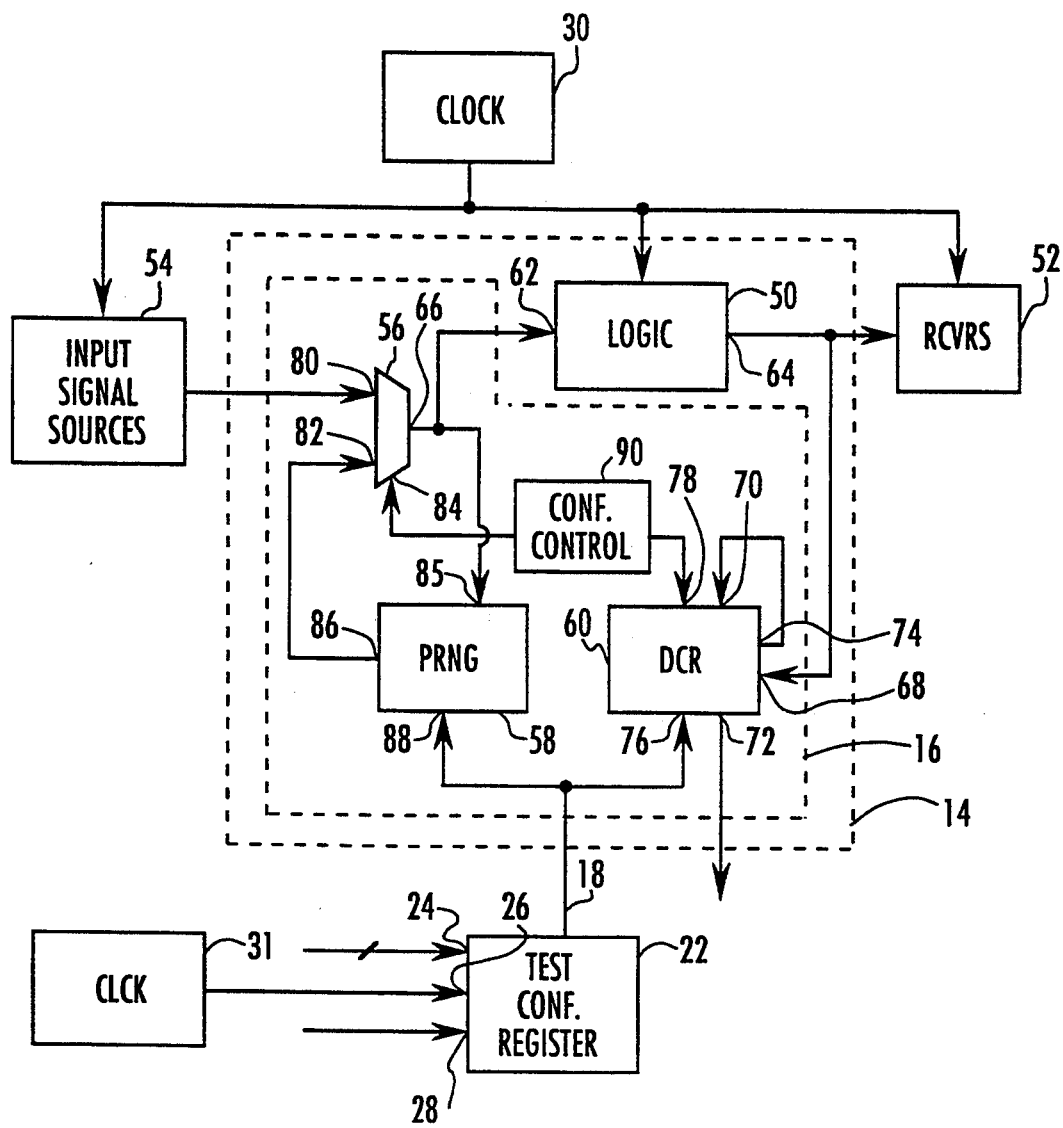
FIG. 2 is a schematic block diagram illustrating the principle components of a BIST-equipped logic component in accordance with the present invention.

Referring to FIG. 2, the test logic 16 of the system components 14 is illustrated in greater detail. The test configuration register 22 is coupled to testing logic 16 by conductor 18. According to the preferred embodiment of the invention, testing logic 16 includes a DCR 60, a multiplexer 56, and a PRNG 58. While the operation of test configuration register 22 will be described in reference to particular testing logic components, test configuration register 22 may be used to control any testing logic components having a low power state.

In general, test configuration register 22 disables testing logic 16 when it is not in use, and supplies a clock signal path to testing logic 16 when the testing logic 16 is needed to perform testing operations, such as self-testing, self-checking, single-step testing, and interval testing. Prior to the use of testing logic 16, test configuration register 22 is placed in the TEST-ON mode by applying a valid key signal to key input 24. When the testing operations are competed, test configuration register 22 is placed in the TEST-OFF mode by triggering reset input 28, thus placing testing logic 16 in the low power state.

Testing logic 16 is disposed in BIST-equipped logic component 14 which comprises, in addition to testing logic 16, a logic module 50. Logic module 50 is driven by system clock 30 and is coupled to normal input signal sources 54 and normal processed signal receivers 52.

Normal signal sources 54 and normal processed signal receivers 52 generally represent the electronic components and circuitry with which logic module 50 interacts in a given application. The nature and logic of these components will vary according to the application implemented. Signal sources 54 change states as they are driven by system clock 30. For example, signal sources 54 may include a programmed microprocessor driven by system clock 30. At each cycle of clock 30, the microprocessor executes an instruction, and the microprocessor's program counter increments to point at the next instruction to be performed. The execution of the instruction causes the state of the components of signal sources 54 to change.

Logic module 50 may be a conventional programmable logic array, and generally comprises an input port 62, and an output port 64. Logic module 50 is designed to generate an output signal at output port 64 responsive to an input signal applied to input port 62. The relationship between the input and output signals of logic module 50 is determined by the specific function implemented by logic module 50, which will vary according to each application. Input port 62 is connected to an output port 66 of multiplexer 56.

Output port 64 of logic module 50 is connected to a data input port 68 of DCR 60, and to processed signal receivers 52. Responsive to signals applied at input port 62, logic module 50 transmits an output signal at output port 64. The output signal is transmitted to processed signal receivers 52 which operate responsive thereto. As mentioned above, the specific circuitry and components represented by processed signal receivers 52 will vary based on the specific application addressed.

DCR 60 is a data compression register having a low power state. DCR 60 generally comprises the data input port 68, a feedback input port 70, a signal out port 72, a feedback out port 74, a clock input 76, and a read input 78. When a LOW is applied at clock input 76, DCR 60 is in the low power state. When a timing signal is applied at clock input 76, DCR 60 is in the normal state. In the normal state, the signal applied at read input 78 determines the affect of the timing signals. Specifically, while read input 78 is LOW, the data supplied at data input port 68 is combined and shifted with the current contents of DCR 60, at each pulse applied to clock input 76. Through linear shift feedback from feedback out port 74 to input port 70, the result of previous combinations is also combined with the data from input port 68. While a logical HIGH is applied at read input 78, the current contents of DCR 60 are accessed by applying clock pulses to clock input 76. At each pulse, one bit of the contents of DCR 60 is made available at signal out port 72. The sequence of bits thus output at signal out port 72 comprises an output signature which may be compared with a predetermined correct signature.

Multiplexer 56 generally comprises a plurality of input ports 80 and 82, a source selection port 84, and output port 66. The signal applied at source selection port 84 determines which input port of multiplexer 56 will be coupled to output port 66. Specifically, when a logical LOW is applied at source selection port 84, input port 80 is coupled to output port 66. Conversely, when a logical HIGH is applied at source selection port 84, input port 82 is coupled to output port 66. Output port 66 is connected to an input port 85 of PRNG 58 and input port 62 of logic module 50. Input port 80 is connected to signal sources 54, and input port 82 is connected to an output port 86 of PRNG 58.

PRNG 58 is a pseudo-random number generator having a low power state, and generally comprises a clock input 88, input port 85, and output port 86. When a LOW is applied to clock input 88, PRNG 58 is in the low power state. When a pulse is applied to clock input 88, PRNG 58 enters the normal state and generates a random number at port 86. PRNG 58 is reseeded with its previous output, which is recycled through input port 85.

Multiplexer 56 and DCR 60 are preferably controlled by a configuration control 90 as disclosed in the copending U.S. patent application Ser. No. No. 07/936,895, entitled PROGRAMMABLE LOGIC SYSTEM WITH SELF-CHECKING, filed on even day herewith in the name of Mike Pedneau, the contents of which are incorporated herein by reference. Alternatively, logic component 14 may be a conventional BIST-equipped logic component, in which multiplexer 56 and DCR 60 are controlled in unison through source selection port 84 and read input 78, respectively.

According to the preferred embodiment of the invention, the input source to logic module 50 and the read status of DCR 60 are independently selectable through signals applied by configuration control 90 to source selection port 84 and read input 78, respectively. By decoupling the control of multiplexer 56 and DCR 60, testing logic 16 may perform self-checking (verification of the components external to logic component 14) as well as self-testing (verification of logic module 50, the internal logic of logic component 14), and may provide advanced verification features not available in conventional BIST-equipped architectures.

Configuration control 90 may control multiplexer 56 and DCR 60 to emulate the modes provided by conventional BIST circuits. For example, a logical LOW may be applied to source selection port 84 of multiplexer 56, while a HIGH is applied to read input 78 of DCR 60 by configuration control 90. Thus configured, data will flow from signal sources 54 through logic module 50 to processed signal receivers 52 without affecting DCR 60. Since DCR 60 and PRNG 58 are not used in this mode, test configuration register 22 may apply a LOW at clock inputs 76 and 88 to disable DCR 60 and PRNG 58 to save the energy that they would otherwise consume.

To test logic module 50, a logical HIGH may be applied at source selection port 84 of multiplexer 56 while a LOW is applied to read input 78 of DCR 60 by configuration control 90. A valid key signal is applied to key input 24 to place test configuration register in the TEST-ON mode, and clock pulses are applied to clock input 26. Thus configured, data flows from PRNG 58 through logic module 50 and is read into DCR 60 at input port 68 as clock pulses are applied through test configuration register 22, over conductor 18 to clock inputs 76 and 88. After a predetermined number of cycles, the signature of DCR 60 may be compared to a predetermined correct signature through port 72, as described above, to verify the internal integrity of logic module 50.

Test configuration register 22 may also be placed in the TEST-ON mode when testing logic 16 is required to perform self-checking. For example, configuration control 90 may provide a logical LOW at read input 78, while providing a logical LOW at source selection port 84. In this configuration, data flows from signal sources 54 through logic module 50 to processed signal receivers 52 to allow normal system operation. Without obstructing normal operation, DCR 60 reads and compresses the data generated at output port 64 of logic module 50, as DCR 60 is driven by a clock signal applied through test configuration register 22. After a predetermined number of clock cycles, configuration control 90 may then apply a logical HIGH at read input 78, and clock input 76 may be pulsed to supply an output signature at signal out port 72. The output signature may be compared with a predetermined correct signature to determine whether an error has occurred. A failure of the output signature to match the predetermined correct signature indicates an error within logic module 50, an error within signal sources 54, or both.

Test configuration register 22 may also be placed in the TEST-ON mode when testing logic 16 is required to perform single-step checking. Single-step checking allows for verification of input signal sources 54 after each cycle of system clock 30. To begin single-step checking, test configuration register 22 is placed in the TESTON mode by applying a valid key signal to key input 24. Then configuration control 90 provides a logical LOW to read input 78. A logical LOW is applied to source selection port 84 by configuration control 90, allowing data to flow from signal sources 54 to logic module 50. At the first cycle of system clock 30, the state of sources 54 is altered and data indicative of the new state is transmitted from sources 54 to input port 62 through multiplexer 56. The data at input port 62 is manipulated according to the internal logic of logic module 50 and transmitted to processed signal receivers 52. A pulse is applied to clock input 76 through test configuration register 22, causing the output at logic component to be read into DCR 60. A logical HIGH is then applied to read input 78 by configuration control 90 and pulses are applied to clock input 76 through test configuration register 22 to produce the current output signature of DCR 60 at signal out port 72. This output signature is then compared to a predetermined correct signature to verify that no error occurred during the first cycle of clock 30.

A logical LOW is again applied to read input 78 by configuration control 90, and system clock 30 executes a second cycle. At the second cycle of system clock 30, the state of sources 54 is again altered and data indicative of the new state is transmitted from sources 54 to input port 62 through multiplexer 56. The data at input port 62 is manipulated according to the internal logic of logic module 50 and transmitted to processed signal receivers 52. A pulse is applied to clock input 76 through test configuration register 22, causing the output at logic module 50 to be read into, and combined with the previous contents of, DCR 60. Configuration control 90 then applies a logical HIGH to read input 78 and pulses are applied to clock input 76 to produce the current signature of DCR 60 at signal out port 72. This signature is then compared to a second correct signature to verify that no error occurred during the second cycle of clock 30. These steps may be repeated to verify the integrity of input sources 54 and logic module 50 at each cycle of system clock 30.

To perform the single-step checking process described above, clock input 26 must be driven by a timing source that does not affect signal sources 54. Thus, clock 31 may be used to drive clock input 76 through test configuration register 22, or circuitry may be provided to isolate system clock 30 from signal sources 54 during the cycles required to generate the output signatures of DCR 60.

Test configuration register 22 may also be placed in the TEST-ON mode when testing logic 16 is required to perform interval checking, where signal sources 54 are checked every nth cycle of system clock 30. For example, the single stepping process described above may be modified so that the system is checked after every twentieth cycle of clock 30. Thus configured, a logical LOW is applied to read input 78 by configuration control 90 until the twentieth cycle of system clock 30. The configuration control 90 then applies to read input 78 a logical HIGH. Subsequent cycles of clock 30 are applied to clock input 76 to produce an output signature at signal out port 72. When the signature has been produced, configuration control 90 again applies to read input 78 a logical LOW until the fortieth cycle of system clock 30, when the above described process is repeated. Interval checking is advantageous in that it can be performed during real-time operation of logic module 50 while being driven by system clock 30. However, interval checking is less thorough than single-step testing in that the outputs generated by logic module 50 during the clock cycles used to generate output signatures are not themselves reflected in any output signatures. In addition, the specific instruction whose execution causes an error is not detectable by interval testing, although the range of instructions corresponding to the interval during which the error occurred may be identified.

In an alternate embodiment, multiplexer 56 and PRNG 58 may be removed, and sources 54 may be tied directly to input port 62 of logic module 50. In this configuration, self-checking can be performed according to the methods described above. However, self-testing is not provided by this alternate embodiment, since logic module 50 cannot be independently tested. Thus, errors detected in the output signal of logic module 50 may indicate either an error in logic module 50 or in signal sources 54.

Figure 3:
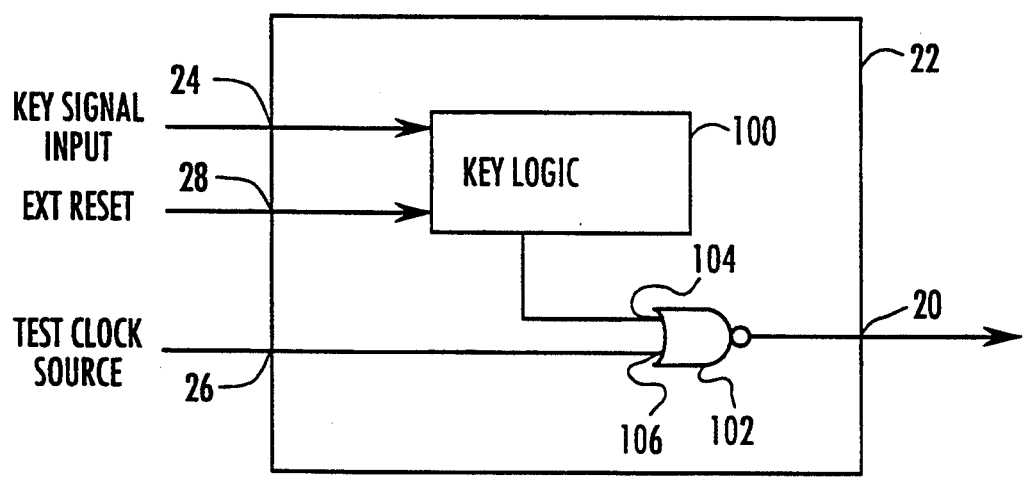
FIG. 3 is a schematic block diagram illustrating the manner in which a configuration register may be implemented for controlling testing logic in accordance with the present invention.

Referring to FIG. 3, test configuration register 22 is shown according to a preferred embodiment of the invention. Test configuration register 22 generally comprises key logic 100 and a NOR gate 102 having a plurality of inputs 104 and 106.

Key logic 100 is coupled to key input 24 and reset input 28 and is disposed to generate a mode signal to NOR gate 102 responsive to the signals at key input 24 and reset input 28. When a signal applied at key input 24 matches a predetermined valid data pattern, the mode signal generated by key logic 100 is a signal that will allow clock input 26 to control output 20 (an enable signal). Because gate 102 is a NOR gate, the enable signal generated by key logic 100 is a logical LOW. Gate 102 may alternatively be an AND gate, in which case the enable signal generated by key logic 100 would be a logical HIGH. The particular data pattern that causes key logic 100 to generate an enable signal at input 104 is determined by the specific logic configuration in key logic 100.

While key logic 100 is applying an enable signal to input 104, test configuration register 22 is in the TEST-ON mode. In this mode, when a LOW is applied at input 106 through clock input 26, output 20 goes HIGH. Conversely, when a HIGH is applied at input 106 through clock input 26, output 20 goes LOW. Thus, when a clock signal is applied at clock input 26 while test configuration register 22 is in the TEST-ON mode, an inverted clock signal is generated at output 20. Test configuration register 22 will remain in the TEST-ON mode until reset input 28 is triggered.

When reset input 28 is triggered, key logic 100 resets and generates a disable signal (a signal to drive the output of gate 102 LOW regardless of the signal at input 106) to input 104, thus returning configuration register 22 to the TEST-OFF mode. In the preferred embodiment, gate 102 is a NOR gate, so the disable signal will be a logical HIGH. While the mode signal generated by key logic 100 to input 104 remains a disable signal, the signal at output 20 will remain LOW, regardless of the signal applied at clock input 26. The signal at input 104 remains a disable signal, and configuration register remains in the TEST-OFF mode, until a valid key signal is again applied to key input 24.

While the present invention has been described in terms of specific embodiments, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A configuration register for controlling a logic testing circuit, said logic testing circuit being coupled to a logic module for testing the integrity of said logic module, said logic testing circuit having a normal state and a low power state, said configuration register comprising:
   a key input disposed to receive a key signal;
   a reset input disposed to receive a reset signal;
   an output coupled to said logic testing circuit;
   a key logic circuit coupled to said key input, said reset input, and said output, said key logic circuit generating to said logic testing circuit, through said output, a control signal responsive to said key signal and said reset signal;
   wherein said control signal drives said logic testing circuit to said low power state when said reset input is triggered by said reset signal; and
   wherein said control signal drives said logic testing circuit to said normal state when said key signal matches a predetermined data pattern.

2. The configuration register of claim 1 wherein said control signal is a clock signal when said key signal matches said predetermined pattern, and wherein said output is coupled to a clock port of said logic testing circuit.

3. The configuration register of claim 2 further comprising a clock input coupled to a clock signal source, said clock signal being generated responsive to a signal generated by said clock signal source.

4. The configuration register of claim 3 wherein said logic testing circuit is disposed to test a logic module driven by a system clock, and wherein said clock signal source operates independent of said system clock.

5. The configuration register of claim 3 further comprising a NOR gate, wherein said key logic circuit and said clock input are coupled to said output through said NOR gate.

6. A circuit arrangement comprising:
   a logic component having a logic module and a built-in logic testing circuit, said logic testing circuit being coupled to said logic module for testing the integrity of said logic module and having a normal state and a low power state, wherein said logic testing circuit may be disabled to save power when testing operations are not being performed;
   a configuration register for controlling said logic testing circuit, said configuration register comprising
   a key input disposed to receive a key signal,
   a reset input disposed to receive a reset signal,
   an output coupled to said logic testing circuit, and
   a key logic circuit coupled to said key input, said reset input, and said output, said key logic circuit generating to said logic testing circuit, through said output, a control signal responsive to said key signal and said reset signal;
   wherein said control signal drives said logic testing circuit to said low power state when said reset input is triggered by said reset signal; and
   wherein said control signal drives said logic testing circuit to said normal state when said key signal matches a predetermined data pattern.

7. The arrangement of claim 6 wherein said control signal is a clock signal when said key signal matches said predetermined data pattern, and wherein said output is coupled to a clock port of said logic testing circuit.

8. The arrangement of claim 7 further comprising a clock signal source, wherein said configuration register further comprises a clock input disposed to receive said clock signal from said clock signal source.

9. The arrangement of claim 8 further comprising a system clock disposed to drive said logic module, and wherein said clock signal source operates independent of said system clock.

10. The arrangement of claim 9 wherein said configuration register further comprises a NOR gate, wherein said key logic circuit and said clock input are coupled to said output through said NOR gate.

11. The arrangement of claim 6 wherein said logic testing circuit has a clock port and wherein the state of said logic testing circuit is responsive to a signal at said clock port.

12. The arrangement of claim 11 wherein said output is coupled to said clock port, said logic testing circuit is driven to said low power state when a LOW is applied to a clock port, and wherein said control signal is LOW when said reset input is triggered by said reset signal.

13. The arrangement of claim 11 wherein said output is coupled to said clock port, said logic testing circuit is driven to said normal state when a clock signal is applied to a clock port, and wherein said control signal is a clock signal when said key signal matches said predetermined data pattern.

14. The arrangement of claim 6 wherein the logic testing circuit comprises a pseudo-random number generator and a data compression register, said pseudo-random number generator being coupled to an input of said logic module through a multiplexer, and said data compression register being coupled to an output of said logic module.

15. A circuit arrangement comprising:
   a logic component having a logic module and a built-in logic testing circuit for testing the integrity of said logic module, said logic testing circuit being coupled to said logic module and having a normal state and a low power state, said logic testing circuit further having a clock port, wherein the state of said logic testing circuit is responsive to a control signal applied at said clock port, wherein said logic testing circuit may be disabled to save power when testing operations are not being performed;
   a configuration register for controlling said logic testing circuit, said configuration register comprising
   a key input disposed to receive a key signal,
   a reset input disposed to receive a reset signal,
   a clock input disposed to receive a clock signal, a signal output coupled to the clock port of said logic testing circuit, a key logic circuit coupled to said key input and said reset input, wherein said key logic circuit generates a mode signal responsive to said key signal and said reset signal, wherein said mode signal is a disable signal when said reset input is triggered by said reset signal, and wherein said mode signal is an enable signal when said key signal matches a predetermined data pattern, and a logic gate having inputs coupled to said clock input and said key logic circuit and an output coupled to said signal output, said logic gate generating at said signal output said control signal responsive to said clock signal and said mode signal; and wherein said control signal drives said logic testing circuit to a low power state when said mode signal is said disable signal, and wherein said control signal drives said logic testing circuit to said normal state when said mode signal is said enable signal.

16. The arrangement of claim 15 wherein said logic gate is a NOR gate, said disable signal is a logical HIGH, and said enable signal is a logic LOW.

17. The arrangement of claim 15 further comprising a clock signal source coupled to said clock input, said clock signal source generating said clock signal.

18. The arrangement of claim 17 further comprising a system clock, wherein said logic module is driven by said system clock, and wherein said clock signal source operates independent of said system clock.

19. The arrangement of claim 15 wherein said key input is a multi-bit digital input and wherein said predetermined data pattern is determined by the configuration of the components of said key logic circuit.

20. The arrangement of claim 15 further comprising a Vcc pin coupled to said clock input, wherein said control signal drives said logic testing circuit to said low power state when a HIGH is applied at said Vcc pin.

21. A method of controlling a logic testing circuit, said logic testing circuit being coupled to a logic module for testing the integrity of said logic module, said logic testing circuit having a low power state and a normal state, comprising:

providing a configuration register coupled to said logic testing circuit, said configuration register having a key input and a reset input, wherein said configuration register generates to said logic testing circuit a control signal, wherein further the state of said logic testing circuit is responsive to said control signal;

generating a control signal to drive said logic testing circuit to said normal state when a signal that matches a predetermined data pattern is applied to said key input of said configuration register; and generating a control signal to drive said logic testing circuit to said low power state when said reset input of said configuration register is triggered.

22. The method of claim 21 wherein said control signal is a clock signal when said key signal matches said predetermined data pattern, and wherein said control signal is applied to a clock port of said logic testing circuit.

23. The method of claim 22 further comprising the step of providing a clock signal source, wherein said configuration register further comprises a clock input disposed to receive a signal from said clock signal source, wherein said clock signal is generated in response to said signal from said clock signal source.

24. The method of claim 23 wherein said configuration register comprises a key logic circuit, said key logic generating a mode signal in response to the signals at said key input and said reset input, wherein said mode signal is applied to a first input of a logic gate, wherein said clock input is coupled to a second input of said logic gate, wherein said control signal is generated at the output of said logic gate in responsive to said mode signal and the signal from said clock signal source.

* * * * *